(12) United States Patent
Tsai et al.

(10) Patent No.: US 6,857,865 B2
(45) Date of Patent: Feb. 22, 2005

(54) MOLD STRUCTURE FOR PACKAGE FABRICATION

(75) Inventors: Chung-Che Tsai, Hsinchu (TW); Wei-Heng Shan, Hsinchu (TW)

(73) Assignee: UltraTera Corporation (TW)

( * ) Notice: Subject to any disclaimer, the term of this patent is extended or adjusted under 35 U.S.C. 154(b) by 143 days.

(21) Appl. No.: 10/176,145

(22) Filed: Jun. 20, 2002

(65) Prior Publication Data

US 2003/0235636 A1 Dec. 25, 2003

(51) Int. Cl.⁷ ............................. B29C 45/14; H01L 21/56
(52) U.S. Cl. ...................... 425/116; 425/121; 425/125; 425/127; 425/129.1; 425/544
(58) Field of Search .................... 425/116, 121, 425/123, 125, 127, 129.1, 544; 264/272.17, 272.14; 438/116, 127

(56) References Cited

U.S. PATENT DOCUMENTS

| | | | | |
|---|---|---|---|---|
| 3,972,663 A | * | 8/1976 | Taniguchi ............... | 425/125 |
| 4,044,984 A | * | 8/1977 | Shimizu et al. ......... | 425/127 |
| 4,372,740 A | * | 2/1983 | Kuramochi et al. ..... | 425/544 |
| 4,779,835 A | * | 10/1988 | Fukushima et al. ..... | 425/116 |
| 5,059,105 A | * | 10/1991 | Baird ..................... | 425/116 |
| 5,484,274 A | * | 1/1996 | Neu ....................... | 425/121 |
| 5,609,889 A | * | 3/1997 | Weber ..................... | 425/544 |
| 5,656,549 A | * | 8/1997 | Woosley et al. ......... | 264/272.17 |
| 5,766,650 A | * | 6/1998 | Peters et al. ............ | 425/129.1 |
| 5,777,391 A | * | 7/1998 | Nakamura et al. ....... | 257/778 |
| 5,779,958 A | * | 7/1998 | Nishihara et al. ....... | 264/272.17 |
| 5,783,134 A | * | 7/1998 | Yabe et al. ............. | 264/272.14 |
| 6,414,396 B1 | * | 7/2002 | Shim et al. ............. | 257/778 |

FOREIGN PATENT DOCUMENTS

JP          04179130 A   *  6/1992  ........... H01L/21/56

* cited by examiner

*Primary Examiner*—Robert B. Davis
(74) *Attorney, Agent, or Firm*—Peter F. Corless; Steven M. Jensen; Edwards & Angell, LLP

(57) ABSTRACT

A mold structure for package fabrication is proposed, and includes a top mold, a fixture and a bottom mold. The top mold is formed with at least an upwardly recessed portion; the fixture is formed with a plurality of downwardly recessed portions; and the bottom mold has a recessed cavity for receiving the fixture therein, and adapted to be engaged with the top mold, wherein a resilient member is disposed on an inner wall of the recessed cavity, and interposed between the fixture and the recessed cavity of the bottom mold, allowing the resilient member to provide a resilient force for properly positioning the fixture. By using the above mold structure, chips mounted on a substrate can be firmly supported in the mold structure without causing chip cracks during a molding process for encapsulating the chips.

11 Claims, 4 Drawing Sheets

MOLD STRUCTURE FOR PACKAGE FABRICATION

FIELD OF THE INVENTION

The present invention relates to molds for package fabrication, and more particularly, to an encapsulating mold for use to form semiconductor packages.

BACKGROUND OF THE INVENTION

Window-type semiconductor packages are advanced packaging technology, characterized by forming at least an opening penetrating through a substrate, allowing a chip to be mounted over the opening, and electrically connected to the substrate by bonding wires through the opening. Such a structure is beneficial for shortening length of the bonding wires, thereby making electrical transmission or performances between the chip and the substrate more efficiently implemented.

As shown in FIG. 4A, for fabricating window-type packages in a batch manner, it is usually first to form a plurality of lower encapsulants 10 on a lower surface 110 of a substrate 11. The lower encapsulants 10 respectively encapsulate bonding wires 12 formed through openings 111 of the substrate 11, so as to protect the bonding wires 12 against external impact or contaminant, and to allow chips 13 mounted on an upper surface 112 of the substrate 11 to be well electrically connected to the substrate 11 by the bonding wires 12.

In order to encapsulate the chips 13 mounted on the substrate 11 for protection purpose, as shown in FIG. 4B, during a molding process, the semi-fabricated package structure is placed in a mold structure composed of a top mold 14 and a bottom mold 15. The top mold 14 is formed with a plurality of upwardly recessed portions 140 for respectively receiving the chips 13. The bottom mold 15 is formed with a plurality of downwardly recessed portions 150 for being engaged with the lower encapsulants 10 respectively, with dimensional tolerance being around 1 mm spacing or clearance 16 between a pair of corresponding downwardly recessed portion 150 and lower encapsulant 10. When a resin compound e.g. epoxy resin (as indicated by arrows in the drawing) is injected into the upwardly recessed portions 140 during molding, mold flow impact of the resin compound would possibly cause cracks (indicated by corrugated lines in the drawing) of the chips 13 at positions corresponding to the spacing or clearance 16 between downwardly recessed portions 150 and lower encapsulants 10, due to lack of support from the bottom mold 15 to cracking positions of the chips 13, thereby making quality and yield of fabricated package products undesirably deteriorated.

Therefore, how to develop a mold structure for assuring structural intactness of chips during a molding process for encapsulating the chips, is a critical problem to solve.

SUMMARY OF THE INVENTION

A primary objective of the present invention is to provide a mold structure for package fabrication, allowing chips mounted on a substrate to be firmly supported by the mold structure without causing chip cracks during a molding process for encapsulating the chips.

In accordance with the above and other objectives, the present invention proposes a mold structure for package fabrication, comprising: a top mold formed with at least an upwardly recessed portion; a fixture formed with a plurality of downwardly recessed portions; and a bottom mold having a recessed cavity for receiving the fixture therein, and adapted to be engaged with the top mold, wherein a resilient member is disposed on an inner wall of the recessed cavity, and interposed between the fixture and the recessed cavity of the bottom mold, allowing the resilient member to provide a resilient force for properly positioning the fixture.

In fabrication of window-type semiconductor packages, a substrate mounted with a plurality of chips and lower encapsulants opposed to the chips, is placed on the fixture of the mold structure. The fixture is properly positioned by the resilient member and the bottom mold in a manner that, the downwardly recessed portions of the fixture are adapted to be completely engaged with the lower encapsulant without forming any undesirable spacing or clearance between a set of corresponding downwardly recessed portion and lower encapsulant. Therefore, during a molding process for forming at least an upper encapsulant for encapsulating the chips, the chips can be firmly supported by the fixture without causing chip cracks due to spacing or clearance between a downwardly recessed portion of a bottom mold and a lower encapsulant in the prior art; therefore, the invention can well assure structural intactness of the chips, and improve quality and yield of fabricated package products.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENT

Preferred embodiments for a mold structure proposed in the present invention are described in more detail as follows with reference to FIGS. 1 to 3. The drawings only illustrate components or parts of the test fixture in simplicity; it should be understood that, these components or parts are not drawn in real sizes or numbers, and the mold structure of the invention is structurally more complex in practical fabrication.

First Preferred Embodiment

Figure 1:
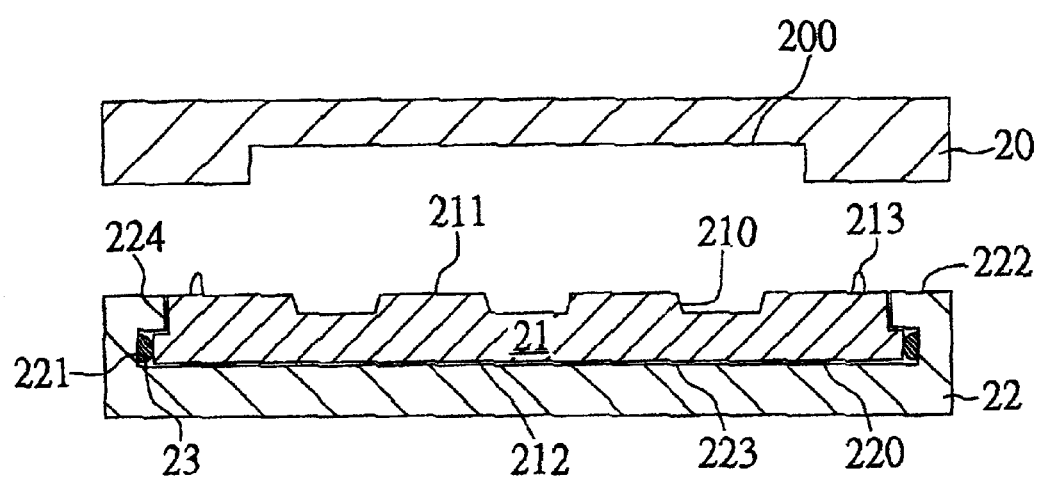
FIG. 1 is a cross-sectional view of a first preferred embodiment of a mold structure of the invention.

FIG. 1 illustrates a first embodiment of a mold structure of the invention. As shown in the drawing, the mold structure comprises: a top mold 20 formed with an upwardly recessed portion 200; a fixture 21 formed with a plurality of downwardly recessed portions 210; and a bottom mold 22 having a recessed cavity 220 for receiving the fixture 21 therein, and adapted to be engageable with the top mold 20, wherein a resilient member 23 is disposed on an inner wall 221 of the recessed cavity 220, and interposed between the fixture 21 and the recessed cavity 220 of the bottom mold 22, allowing the resilient member 23 to provide a resilient force for properly positioning the fixture 21. The resilient member 23 can be, but not limited to, a spring or made of elastomer; other resilient mechanisms capable of providing a resilient force are also suitably adopted in this invention.

The fixture 21 has an upper surface 211 and a lower surface 212 opposed to the upper surface 211. The upper surface 211 is flush with a surface 222 of the bottom mold 22 where an opening of the recessed cavity 220 is formed, and the lower surface 212 of the fixture 21 abuts against a bottom 223 of the recessed cavity 220 of the bottom mold 22. The fixture 21 is further formed with a plurality of pins 213 protruding upwardly from a peripheral area of the upper surface 211 outside the downwardly recessed portions 210.

The bottom mold 22 can be further formed with a protruding portion 224 that protrudes from the inner wall 221 of the recessed cavity 220 in a manner that, the protruding portion 224 is adapted to be coupled to the fixture 21 and cooperates with the resilient member 23 for properly holding the fixture 21 in position.

Operation of the above mold structure of the invention for package fabrication is detailed as follows with reference to FIGS. 2A–2D. The mold structure is exemplified for fabricating window-type BGA (ball grid array) semiconductor packages; it should be understood, the scope of the invention is not limited to exemplification or embodiments herein.

Figure 2A:
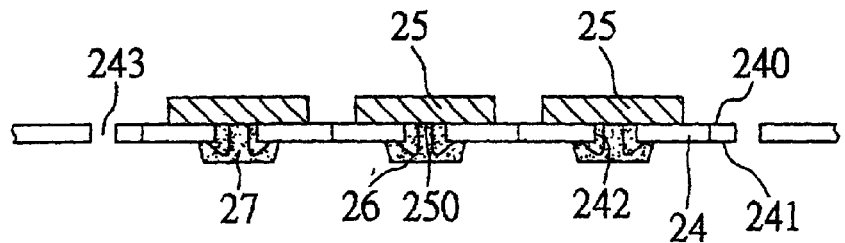
FIGS. 2A–2D are cross-sectional schematic diagrams showing process steps of using the mold structure of FIG. 1 for package fabrication.

Referring to FIG. 2A, the first step is to prepare a plurality of semi-fabricated window-type semiconductor packages that are integrally fabricated in a batch manner. First, a substrate 24 has an upper surface 240 and a lower surface 241 opposed to the upper surface 240, and is formed with a plurality of openings 242 penetrating through the substrate 24. A plurality of chips 25 are mounted on the substrate 24 in a manner that, each of the chips 25 covers an corresponding opening 242, allowing an active surface 250 of the chip 25 to be partly exposed to the opening 242. A plurality of bonding wires 26 are formed through the openings 242 for electrically connecting the active surfaces 250 of the chips 25 to the lower surface 241 of the substrate 24. Then, a plurality of lower encapsulants 27 are formed on the lower surface 241 of the substrate 24 by a molding or printing process, so as to cover the openings 242 respectively and encapsulating the bonding wires 26, wherein the lower encapsulants 27 are made of a conventional resin compound, such as epoxy resin etc.

Figure 2B:
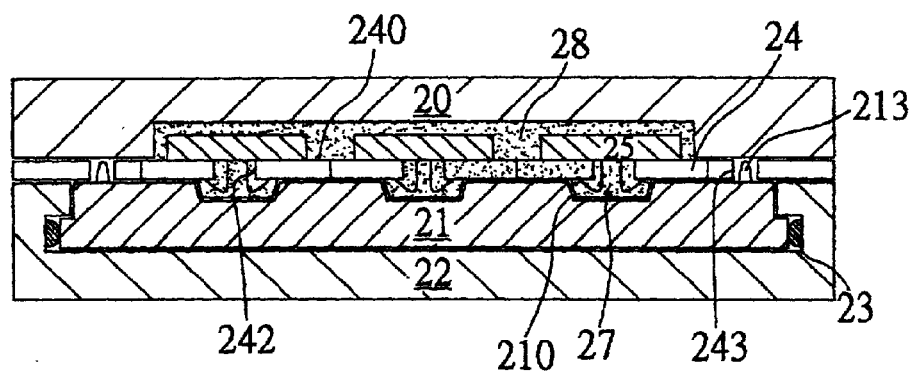

Referring to FIG. 2B, the next step is to place the semi-fabricated window-type semiconductor packages in the mold structure of FIG. 1, so as to form an upper encapsulant (not shown) for encapsulating the chips 25 mounted on the substrate 24. First, the substrate 24 mounted with the chips 25 and the lower encapsulants 27 is disposed on the fixture 21 received by the bottom mold 22 in a manner that, the lower encapsulants 27 are accommodated in the downwardly recessed portions 210 of the fixture 21, wherein the downwardly recessed portions 210 are respectively dimensioned equally to the lower encapsulants 27. The resilient member 23 interposed between the fixture 21 and the bottom mold 22 provides a resilient force to position the fixture 21 in a manner that, the downwardly recessed portions 210 are completely engaged with the lower encapsulants 27. Moreover, the substrate 24 is formed with a plurality of peripherally-situated coupling holes 243 corresponding in position to the pins 213 of the fixture 21, allowing the coupling holes 243 to be coupled to the pins 213 for fixing the substrate 24 on the fixture 21. Therefore, by provision of the resilient member 23 and coupling between the pins 213 and the coupling holes 243, the semi-fabricated semiconductor structure mounted on the substrate 24 can be properly and firmly held in position on the fixture 21 and the bottom mold 22. Then, by clamping the top mold 20 onto the bottom mold 22 with the substrate 24 being peripherally interposed between the top and bottom molds 20, 22, it is ready to perform a molding process and inject a resin compound (e.g. epoxy resin; not shown) for filling into the upwardly recessed portion 200 of the top mold 20, so as to form an upper encapsulant 28 on the upper surface 240 of the substrate 24 for encapsulating the chips 25. The upwardly recessed portion 200 is dimensioned sufficiently for receiving all the chips 25 mounted on the substrate 24 therein.

Figure 2C:
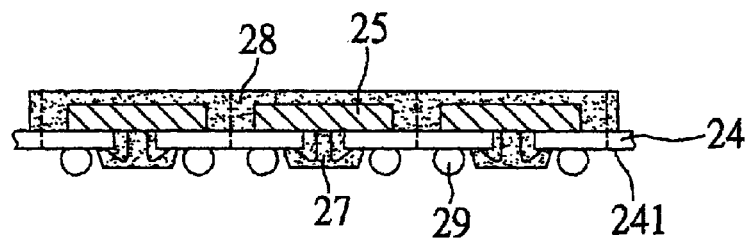

Referring to FIG. 2C, after the molding process is completed and the upper encapsulant 28 is cured, the mold structure, including the top and bottom molds 20, 22 and the fixture 21 (as shown in FIG. 2B), can be removed. The resulted package structure is desirably adapted with all the chips 25 being encapsulated by the upper encapsulant 28.

Then, a ball implantation process is performed to implant a plurality of solder balls 29 on the lower surface 241 of the substrate 24. The solder balls 29 are dimensioned in height larger than thickness of the lower encapsulants 27, and serve as input/output (I/O) connections for electrically connecting the chips 25 to external devices such as a printed circuit board (not shown).

Figure 2D:
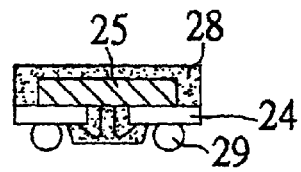

Finally, referring to FIG. 2D, a singulation process is performed to cut through the upper encapsulant 28 and the substrate 24 along dotted lines indicated in FIG. 2C, so as to form individual singulated semiconductor packages; this therefore completes the package fabrication of using the mold structure of the invention.

In conclusion, the mold structure of the invention is characterized by a three-piece mold, comprising: the top mold 20, the fixture 21 and the bottom mold 22, wherein the fixture 21 is received by the bottom mold 22 with the resilient member 23 being interposed therebetween. Such a three-piece mold structure provides significant benefits. When placing the substrate 24 with the chips 25 and the lower encapsulants 27 in the mold structure, the resilient member 23 would provide a resilient force to properly position the fixture 21, so as to allow the downwardly recessed portions 210 of the fixture 21 to be optimally engaged with the lower encapsulants 27 without forming any undesirable spacing or clearance between a set of corresponding downwardly recessed portion 210 and lower encapsulant 27. And, the chips 25 mounted over the lower encapsulants 27 can be firmly supported by the fixture 21 during the molding process for forming the upper encapsulant 28, without causing chip cracks due to spacing or clearance between a downwardly recessed portion of a bottom mold and a lower encapsulant in the prior art; therefore, the invention can well assure structural intactness of the chips 25, and improve quality and yield of fabricated package products.

Second Preferred Embodiment

Figure 3A:
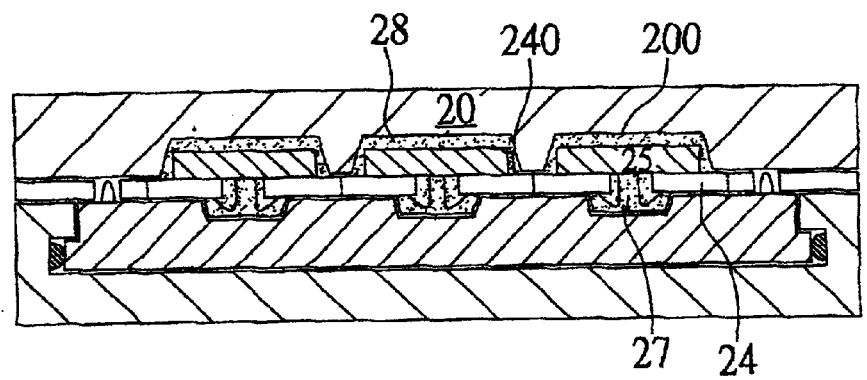
FIGS. 3A–3C are cross-sectional schematic diagrams showing process steps for package fabrication of using a second preferred embodiment of the mold structure of the invention.
Figure 3B:
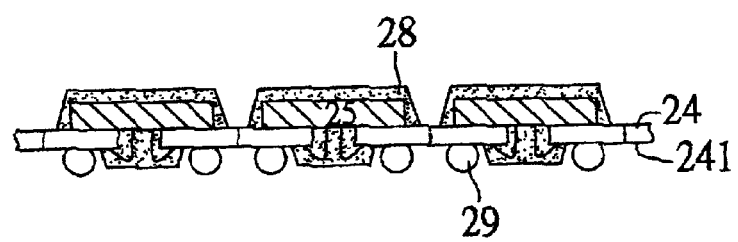
Figure 3C:
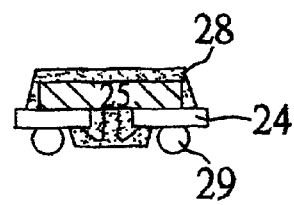
Figure 4A:
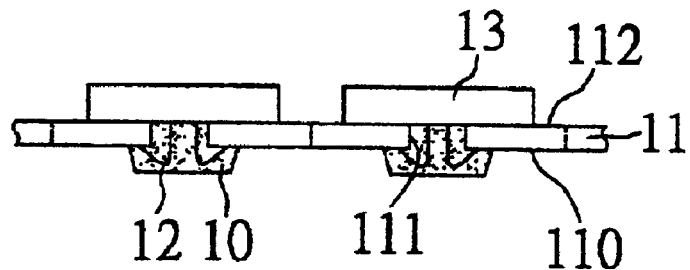
FIGS. 4A and 4B (PRIOR ART) are respectively cross-sectional views of a conventional window-type semiconductor package and a conventional mold structure for package fabrication.
Figure 4B:
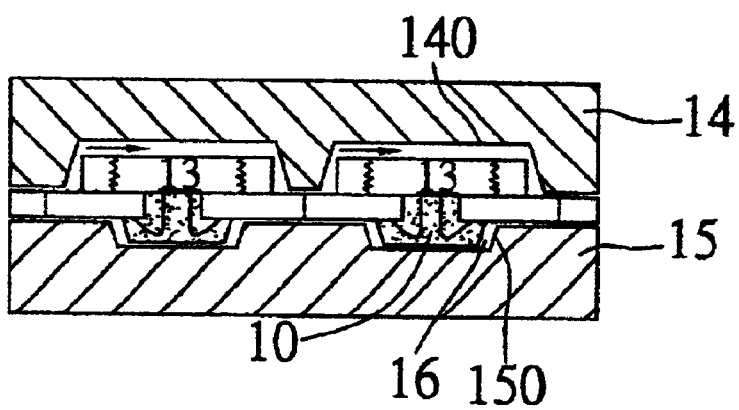

FIGS. 3A—3C illustrate process steps for package fabrication of using a second embodiment of the mold structure of the invention. The second embodiment of the mold structure is similar to the above first embodiment, with the only difference in that, in this embodiment, the top mold 20 is formed with a plurality of upwardly recessed portions 200 respectively corresponding in position to the chips 25 mounted on the substrate 24.

Referring to FIG. 3A, the substrate 24 mounted with the chips 25 and the lower encapsulants 27 is accommodated in the mold structure in a manner that, the chips 25 are respectively received in the upwardly recessed portions 200 of the top mold 20, and the upwardly recessed portions 200 are each dimensioned for sufficiently covering the corresponding chip 25. Then, a molding process is performed, and a resin compound (e.g. epoxy resin) is injected to fill into the upwardly recessed portions 200 of the top mold 20, so as to form a plurality of upper encapsulants 28 on the upper surface 240 of the substrate for encapsulating the chips 25 respectively.

Referring to FIG. 3B, after the molding process is completed, the mold structure can be removed, with the chips 25 being desirably encapsulated by the upper encapsulants 28. Then, a plurality of solder balls 29 are implanted on the lower surface 241 of the substrate 24, for use to electrically connect the chips 25 to external devices such as a printed circuit board (not shown).

Finally, referring to FIG. 3C, the packaged structure is cut through the substrate 24 along dotted lines indicated in FIG. 3B, so as to form individual semiconductor packages.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A mold structure for package fabrication, comprising:
    a top mold formed with at least an upwardly recessed portion;
    a fixture formed with a plurality of downwardly recessed portions; and
    a bottom mold having a recessed cavity for receiving the fixture therein, and adapted to be engaged with the top mold, wherein the bottom mold is formed with a protruding portion protruding from an inner wall of the recessed cavity and a resilient member disposed on the inner wall of the recessed cavity underneath the protruding portion such that the protruding portion cooperates with the resilient member to abut against the same side of the fixture for properly positioning the fixture in the bottom mold.

2. The mold structure of claim 1, wherein the fixture is formed with a plurality of pins protruding upwardly from a peripheral area of the fixture outside the downwardly recessed portions.

3. The mold structure of claim 1, wherein the fixture has an upper surface and a lower surface opposed to the upper surface in a manner that, the upper surface is flush with a surface of the bottom mold where an opening of the recessed cavity is formed, and the lower surface of the fixture abuts against a bottom of the recessed cavity of the bottom mold.

4. The mold structure of claim 1, wherein the resilient member is a spring.

5. The mold structure of claim 1, wherein the resilient member is made of elastomer.

6. A mold structure for package fabrication, for use to form at least an upper encapsulant adapted to encapsulate a plurality of chips mounted on a substrate, wherein each of the chips is mounted on a surface of the substrate in a manner as to cover an opening penetrating through the substrate, and electrically connected to an opposed surface of the substrate by bonding wires through the opening, allowing a plurality of lower encapsulants to be respectively formed on the opposed surface of the substrate for covering the openings and encapsulating the bonding wires, the mold structure comprising:
    a top mold formed with at least an upwardly recessed portion for accommodating the chips mounted on the substrate therein;
    a fixture formed with a plurality of downwardly recessed portions that are adapted to be completely engaged with the lower encapsulants formed on the substrate;
    a bottom mold having a recessed cavity for receiving the fixture therein, and adapted to be engaged with the top mold in a manner as to interpose the substrate between the top and bottom molds and to form the upper encapsulant in the upwardly recessed portion of the top mold, wherein the bottom mold is formed with a protruding portion protruding from an inner wall of the recessed cavity; and
    a resilient member disposed on the inner wall of the recessed cavity underneath the protruding portion such that the protruding portion cooperates with, the resilient member to a but against the same side of the fixture for positioning the fixture in compliance with the lower encapsulants in the bottom mold.

7. The mold structure of claim 6, wherein the fixture is formed with a plurality of pins protruding upwardly from a peripheral area of the fixture outside the downwardly recessed portions.

8. The mold structure of claim 6, wherein the fixture has an upper surface and a lower surface opposed to the upper surface in a manner that, the upper surface is flush with a surface of the bottom mold where an opening of the recessed cavity is formed, and the lower surface of the fixture abuts against a bottom of the recessed cavity of the bottom mold.

9. The mold structure of claim 6, wherein the resilient member is a spring.

10. The mold structure of claim 6, wherein the resilient member is made of elastomer.

11. The mold structure of claim 8, wherein the fixture is formed with a plurality of pins protruding from the upper surface of the fixture outside the downwardly recessed portions, the plurality of pins engaging with a plurality of coupling holes provided in the substrate so as to allow the substrate to be fixed on the fixture.

* * * * *